United States Patent [19]
Hofmeister et al.

[11] Patent Number: 6,068,491
[45] Date of Patent: May 30, 2000

[54] CONNECTOR ARRANGEMENT FOR AN AUTOMOTIVE STEERING SYSTEM WITH A CONTROL UNIT

[75] Inventors: Werner Hofmeister, Muehlacker; Achim Herzog, Backnang; Peter Schiefer, Untergruppenbach; Thomas Raica, Hechingen; Michael Schoenfeld, Leinfelden-Echterdingen; Roland Schmid, Dettingen; Willy Betz, Sachsenheim; Ralf Schinzel, Benningen; Albert Staake, Murr; Rolf Litzinger, Hechingen; Hans Seitel, Esslingen; Edwin Eberlein, Stuttgart; Eberhard Spengler, Markgröningen, all of Germany

[73] Assignee: Robert Bosch GmbH, Stuttgart, Germany

[21] Appl. No.: 09/117,610
[22] PCT Filed: Sep. 25, 1997
[86] PCT No.: PCT/DE97/02176
§ 371 Date: Aug. 3, 1998
§ 102(e) Date: Aug. 3, 1998
[87] PCT Pub. No.: WO98/24658
PCT Pub. Date: Jun. 11, 1998

[30] Foreign Application Priority Data

Dec. 6, 1996 [DE] Germany ............... 296 21 257 U

[51] Int. Cl.[7] .................................................. H01R 33/00
[52] U.S. Cl. ................................ 439/34; 439/34
[58] Field of Search ................ 439/34, 247–8, 439/519, 949; 174/72 A

[56] References Cited

U.S. PATENT DOCUMENTS

| | | |
|---|---|---|
| 4,850,884 | 7/1989 | Mamoru et al. . |
| 4,906,195 | 3/1990 | Mitsuji et al. . |
| 5,288,141 | 2/1994 | Isshiki et al. ............... 439/34 |
| 5,501,605 | 3/1996 | Ozaki et al. ............... 439/34 |
| 5,735,713 | 4/1998 | Sugiura ..................... 439/638 |
| 5,771,575 | 6/1998 | Onizuka et al. ............. 29/868 |
| 5,785,532 | 7/1998 | Maue et al. ............... 439/34 |

FOREIGN PATENT DOCUMENTS

| | | |
|---|---|---|
| 0 130 844 | 1/1985 | European Pat. Off. . |
| 33 10 477 | 1/1984 | Germany . |
| 41 17 179 | 11/1992 | Germany . |
| 43 21 331 | 1/1995 | Germany . |
| 94 17 532 | 3/1996 | Germany . |
| 195 18 136 | 11/1996 | Germany . |

*Primary Examiner*—Lincoln Donovan
*Attorney, Agent, or Firm*—Kenyon & Kenyon

[57] ABSTRACT

A connector arrangement of a control system with a controller in a motor vehicle is designed so that it can be manufactured advantageously and is reliable in operation.

To do so, the connector arrangement and the respective controller are designed so that several separate connector sockets with externally accessible contact elements are arranged on the controller, which is mounted on the vehicle's internal combustion engine as a surface-mounted controller, some of the contact elements being designed as high-current contact elements which are connected directly to one another through busbars running inside the controller.

The respective mating connectors can be connected to the connector sockets, the mating connectors being electrically connected to components of the vehicle over cable harnesses or cable segments, where a first mating connector connected to cable segments is composed of partial mating connectors which can be handled independently of one another.

16 Claims, 2 Drawing Sheets

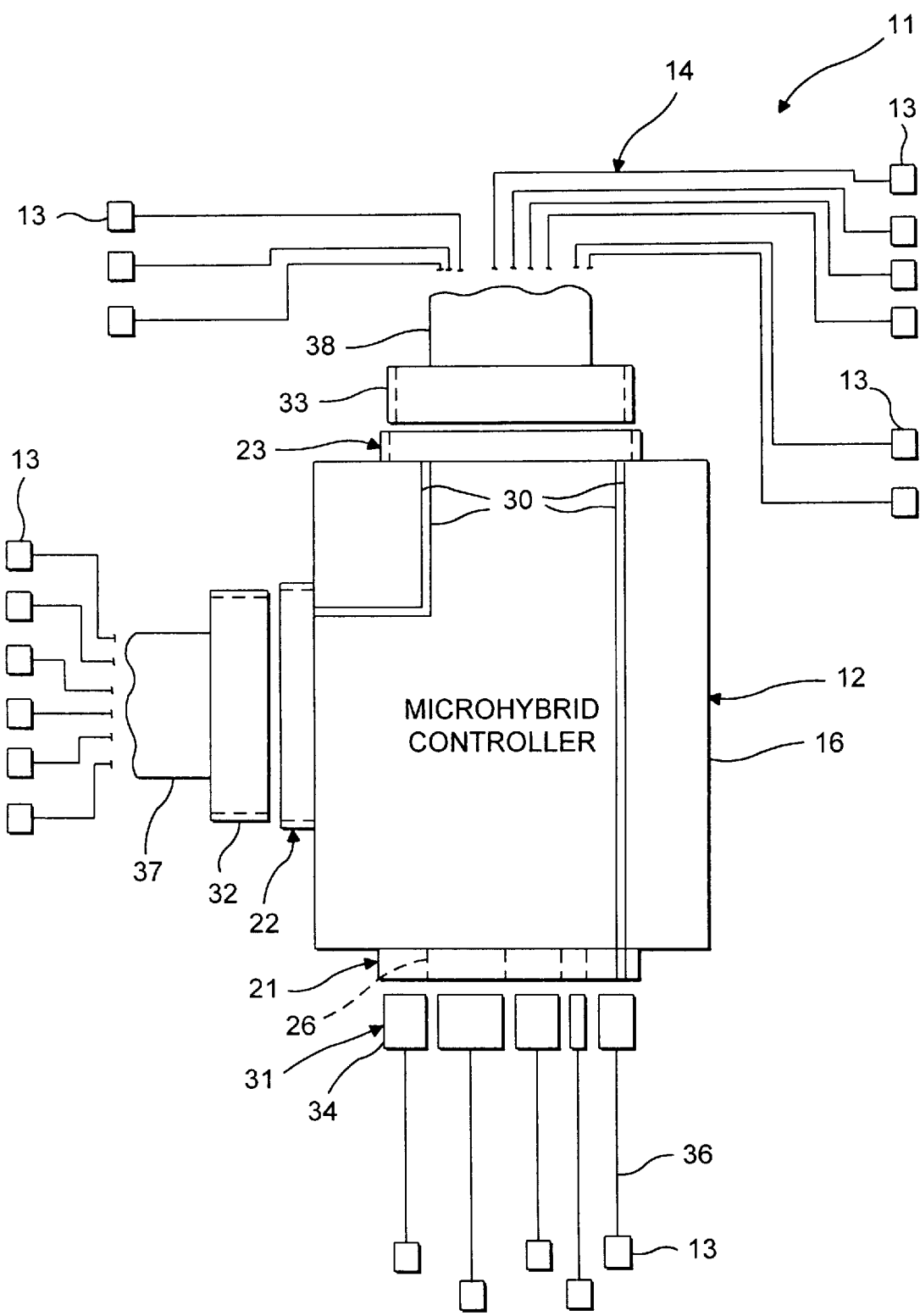
F I G. 1

CONNECTOR ARRANGEMENT FOR AN AUTOMOTIVE STEERING SYSTEM WITH A CONTROL UNIT

FIELD OF THE INVENTION

The present invention relates to a connector arrangement of a control system having a controller in a motor vehicle.

BACKGROUND INFORMATION

German Patent No. DE 33 10 477 describes a controller designed in circuitboard technology as part of a control system in a vehicle. Such a controller is usually accommodated in the passenger compartment or the radiator tank behind the splashboard that seals off the engine compartment of a vehicle, so it is protected from the rough operating conditions in the vehicle's engine compartment.

The controller has a plug connector as a connector socket mounted in an opening in a housing of the controller and includes a plurality of contact elements in rows. The contact elements are connected to electric components on the circuitboard of the controller and can be connected to mating contact elements of a cable harness plug, over which all the input and output signals of the controller are carried.

A plurality of cables, initially bundled as a cable harness, lead away from the cable harness plug to sensors and actuators mounted on the vehicle's internal combustion engine but also, at least indirectly, leading to other electric components accommodated elsewhere in the vehicle, such as light fixtures in the marginal areas of the vehicle or display instruments in the dashboard.

To avoid making the cable harness unwieldy, only groups of components arranged together are connected directly to it, while the connection to individual components is indirect by way of adapters and attached extension cables.

In addition, cables of the cable harness over which high currents flow, e.g., the operating currents of actuators, are not carried through the controller but instead there are splices on the respective cables where these cables branch off. The branches are combined in a disconnector socket from which they ultimately lead to the respective components.

This conventional disclosed embodiment of the control system with a controller having such a design and the respective connector arrangement has the disadvantage of being cost-intensive to manufacture and assemble and susceptible to faults due to the additional contact points because of the use of adapter plugs and the disconnector socket. In addition, changes in the connector arrangement when changes occur in the installation conditions of the electric components in the vehicle can only be made at great expense.

SUMMARY OF THE INVENTION

The connector arrangement according to the present invention of a control system with a controller in a motor vehicle advantageously eliminates the inadequacies of conventional arrangements described above.

Due to the mounting of the controller on the vehicle's internal combustion engine in particular, it is possible to implement a connector arrangement that has short connecting paths and permits modifications based on different installation conditions of the electric components of the vehicle due to the use of partial mating connectors which can be handled independently of one another.

By leading the entire connector arrangement through the controller, the number of contact points can be minimized, thus yielding a high operational reliability of the connector arrangement.

BRIEF DESCRIPTION OF THE DRAWINGS

FIG. 1 shows a schematic of a connector arrangement in accordance with the present invention.

DETAILED DESCRIPTION

Figure 2:
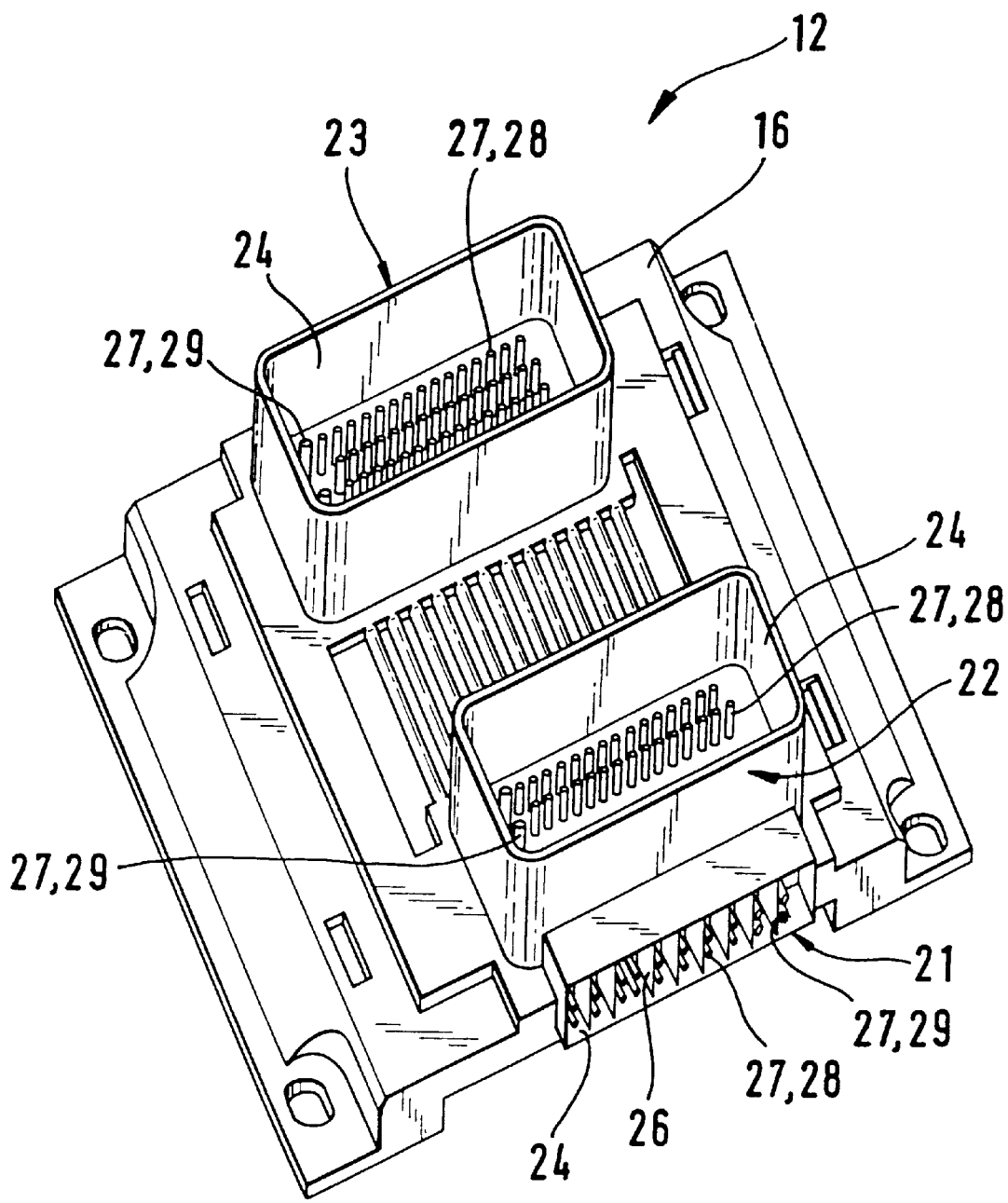
FIG. 2 shows a three-dimensional view of the controller with its connections elements for the connector arrangement in accordance with the present invention.

A control system 11 in a motor vehicle according to FIG. 1 includes as essential components an electric controller 12, a plurality of electrically operated components 13 and a connector arrangement 14 for electric connection of components to controller 12.

Controller 12, shown in greater detail in FIG. 2, is designed as a microhybrid controller 12. The components included in controller 12 are in miniaturized form, so their weight is low and consequently only low inertial forces appear in acceleration. It is therefore possible to design controller 12 as a surface-mounted controller 12, where it is mounted directly on a vehicle's engine, because it is also sufficiently insensitive to soiling, vibrating loads and temperature fluctuations.

Controller 12 has a preferably die-cast housing 16. A first connector socket 21 is mounted on housing 16 as a modular connector, a second connector socket 22 as an engine connector and a third connector socket 23 as a body connector.

Connector sockets 21–23 each have a receptacle area 24 that is accessible outside housing 16 and is subdivided into sections by partitions 26 in the case of connector socket 21. Into each receptacle area contact segments 27 of rows of contact elements 28 project in the form of pins passing through housing 16 with electrical insulation and continuing inside housing 16 with connecting segments (not shown here) that are electrically connected to the respective components of controller 12 at least indirectly.

With regard to their cross-sectional area, contact elements 28 are designed for low signal currents. However, some of contact elements 28 have an enlarged cross-sectional area and are designed as high-current contact elements 29 for transmitting higher currents, compared to signal currents, such as the power supply current for actuators or lamps.

Within controller 12, the respective high-current contact elements 29 of connector sockets 21–23 are connected through directly, usually without intermediate elements of controller 12, by way of a busbar 30 which is advantageously manufactured as a solid metal bridge from a pressed screen.

A first mating connector 31 can be connected to the first connector socket 21, a second mating connector 32 can be connected to the second connector socket 22, and a third mating connector 33 can be connected to the third connector socket 23. As an alternative, there may also be a different number of connector sockets 21–23 and mating connectors 31–33, for example, two.

The first mating connector 31 is made up of multiple partial mating connectors 34 which can be handled independently of one another and to which is connected one end of a cable segment 36. The other end of cable segment 36 comes out of one of components 13, forming a structural unit with it. Partial mating connectors 34 are used in particular with components 13 which, like controller 12, may also be surface-mounted on the vehicle's engine, so they are in close proximity to controller 12. Such components 13 include, for example, an actuator for intake manifold switching, a knock sensor or a temperature sensor for the engine's cooling water.

Second mating connector 32 and third mating connector 33 are each designed in one part. One end of a first cable harness 37 is connected to second mating connector 32 and its other end is branched. These branches lead in particular to components 13, which are connected to the engine, e.g., the actuator for a camshaft adjustment or the lambda probe as a sensor.

In a comparable arrangement, third mating connector 33 is connected to one end of a second cable harness 38 whose branches at the other end lead to components 13 which are arranged on the body of the vehicle in particular, such as a tank level sensor or dashboard display instruments.

Connector arrangement 14 described above in combination with a controller 12 of such a design is an advantageous embodiment of control system 11 from the standpoint of manufacturing technology because connector arrangement 14 has a clear layout, components 13 connected to partial mating connectors 34 can be replaced independently of one another, thus permitting customized adaptation to different configurations of components 13 while retaining a standardized controller 12, and a high operational reliability of control system 11 is achieved due to minimization of contact points because adapter plugs, disconnector sockets and splices are eliminated.

What is claimed is:

1. A connector arrangement for a control system in a motor vehicle, comprising:
    a controller, which is surface mountable on an engine of the motor vehicle, the controller including at least two connector sockets, each of the connector sockets being mounted on an outside surface of the controller and including a plurality of contact elements, at least two of the plurality of contact elements being high-current contact elements, at least one of the high-current contact elements of a first of the connector sockets being coupled to at least one of the high-current contact elements of a second of the connector sockets by at least one electric busbar connecting the at least two connector sockets;
    at least one set of a plurality of cables, each cable having a first end and second end, the second end being adapted to connect to at least one electric component of the vehicle;
    a plurality of mating sub-connectors, a first end of each of the plurality of mating sub-connectors being connected to the first end of each cable of the at least one set of a plurality of cables, a second end of each of the plurality of mating sub-connectors being adapted to couple to a first one of the connector sockets;
    at least one cable harness having a plurality of cables, each cable having a first end and a second end, the second end being adapted to connect to at least one other electric component of the vehicle; and
    at least one mating connector, which is coupled to a first end of the at least one cable harness, and which is adapted to couple to a second one of the connector sockets.

2. The connector arrangement according to claim 1, wherein the controller includes a housing, the at least one busbar being positioned inside the housing, each of the high-current contact elements having a larger cross-sectional area than other ones of the plurality of contact elements.

3. The connector arrangement according to claim 1, wherein the second end of each cable of the at least one set of a plurality of cables comes out of an electric component of the motor vehicle and forms a structural unit with the electric component.

4. The connector arrangement according to claim 1, wherein the controller is a microhybrid controller.

5. The connector arrangement according to claim 1, wherein the housing is a die-cast housing.

6. The connector arrangement according to claim 1, wherein the at least one busbar is a solid metal bridge.

7. The connector arrangement according to claim 6, wherein the solid metal bridge is made using a pressed screen.

8. A connector arrangement for a control system in a motor vehicle, comprising:
    a controller, which is surface mountable on an engine of the motor vehicle, the controller including at least three connector sockets, each of the connector sockets being mounted on an outside surface of the controller and including a plurality of contact elements, at least two of the plurality of contact elements of the connector sockets being high-current contact elements, at least one of the high-current contact elements of at least one of the connector sockets being coupled to at least one of the high-current contact elements of at least another one of the connector sockets by at least one electric busbar, which couples at least two of the connector sockets, wherein at least a first connector socket of the connector sockets includes a plurality of connecting segments;
    at least one set of a plurality of cables, each cable having a first end and a second end, the second end being adapted to connect to at least a first electric component of the vehicle;
    at least a first set of a plurality of mating sub-connectors, a first end of each of the mating sub-connectors being connected to the first end of each cable of the at least one set of a plurality of cables, a second end of each of the plurality of mating sub-connectors being adapted to couple to one of the plurality of connecting segments of the at least a first connector socket;
    a plurality of cable harnesses, each cable harness having a plurality of cables, each cable having a first end and a second end, the second end being adapted to connect to at least one other electric component of the vehicle;
    a mating connector, which is coupled to a first end of one cable harness of the plurality of cable harnesses, and which is adapted to couple to a second one of the connector sockets;
    at least one other mating connector, which is coupled to a first end of another cable harness of the plurality of cable harnesses, and which is adapted to couple to a third one of the connector sockets.

9. The connector arrangement of claim 8, wherein at least the first connector socket is a modular connector, the mating connector is an engine connector and the at least one other mating connector is a body connector.

10. The connector arrangement of claim 9, wherein the modular connector is used to connect the at least a first electric component, which is in close proximity to the controller.

11. The connector arrangement of claim 10, wherein the at least a first electric component is at least one of an actuator for an intake manifold switch, a knock sensor and an engine coolant temperature sensor.

12. The connector arrangement of claim 9, wherein the engine connector connects to at least a second electric component, which is connected to the engine.

13. The connector arrangement of claim 12, wherein the at least a second electric component is at least one of a camshaft adjustment actuator and a lambda probe.

14. The connector arrangement of claim 9, wherein the body connector connects to at least a third electric component, which is situated on a body of the vehicle.

15. The connector arrangement of claim 14, wherein the at least a third electric component is at least one of a tank level sensor and a dashboard display.

16. The connector arrangement of claim 9, wherein the plurality of connecting segments are formed by at least one partition in the at least a first connector socket.

* * * * *